United States Patent
Li et al.

(10) Patent No.: US 12,292,474 B2
(45) Date of Patent: May 6, 2025

(54) LEAKAGE CURRENT DETECTION AND INTERRUPTION DEVICE FOR POWER CORD AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 209 days.

(21) Appl. No.: 18/347,012

(22) Filed: Jul. 5, 2023

(65) Prior Publication Data
US 2025/0004052 A1    Jan. 2, 2025

(30) Foreign Application Priority Data

Jun. 30, 2023 (CN) .......................... 202310790448.7
Jun. 30, 2023 (CN) .......................... 202321691997.0

(51) Int. Cl.
*G01R 31/327* (2006.01)
*G01R 31/52* (2020.01)
*H02H 1/04* (2006.01)

(52) U.S. Cl.
CPC ......... *G01R 31/3278* (2013.01); *G01R 31/52* (2020.01); *H02H 1/04* (2013.01)

(58) Field of Classification Search
CPC ....... G01R 31/3278; G01R 31/52; H02H 1/04
USPC ................................ 324/524, 522, 512, 500
See application file for complete search history.

(56) References Cited

U.S. PATENT DOCUMENTS

| | | | | |
|---|---|---|---|---|
| 4,929,901 A | * | 5/1990 | Kimball | G01R 31/52 324/528 |
| 6,831,819 B2 | * | 12/2004 | Nemir | H02H 3/05 324/424 |
| 8,009,394 B2 | * | 8/2011 | Atoji | G01R 31/52 361/42 |

* cited by examiner

*Primary Examiner* — Giovanni Astacio-Oquendo
(74) *Attorney, Agent, or Firm* — Chen Yoshimura LLP

(57) ABSTRACT

A leakage current detection and interruption (LCDI) device includes a leakage current detection module, including a first and a second leakage current detection line and at least one resistive element and/or at least one semiconductor element, configured to detect a leakage current signal on the first or second current-carrying line and to generate a leakage fault signal in response to detecting the leakage current signal. The first and second leakage current detection lines are electrically insulated from each other, and respectively cover one of the first and second current-carrying lines. The at least one resistive element and/or semiconductor element is coupled in series between the first and second leakage current detection lines to form a current path for detecting an open circuit fault in the leakage current detection module. By detecting the fault in the first and second leakage current detection lines, the reliability of the LCDI device is improved.

16 Claims, 8 Drawing Sheets

LEAKAGE CURRENT DETECTION AND INTERRUPTION DEVICE FOR POWER CORD AND RELATED ELECTRICAL CONNECTORS AND ELECTRICAL APPLIANCES

BACKGROUND OF THE INVENTION

This invention relates to electrical circuits, and in particular, it relates to a leakage current detection and interruption (LCDI) device for a power cord, and related electrical connectors and electrical appliances.

Leakage current detection and interruption (LCDI) device is a fire hazard prevention device for electrical appliances. Its is implemented in a power cord with a plug, and functions to detect any leakage current between the hot and neutral power supply lines and their shield layers along the power cord from the plug to the electrical load (e.g., air conditioner, dehumidifier, etc.). When a leakage current is detected, the LCDI device can disconnect the electrical power from the power source to the appliance, preventing fire hazard and ensuring safety. Thus, LCDI devices can prevent fire hazard caused by arc fault due to physical damage and lost of insulation in the power cord, which may be caused by aging of the hot, neutral and ground wires, wear, pinching, animal chewing, etc.

In some conventional LCDI devices, when the device has lost its protection function due to an open circuit condition in the leakage current detection line for the hot or neutral wire, the power cord can still output power. This is a hidden threat of fire hazard and other hazards.

SUMMARY OF THE INVENTION

Therefore, there is a need for an LCDI device that can detect the proper function of the leakage current detection lines.

To solve the above problems, in a first aspect, the present invention provides a leakage current detection and interruption device, which includes: power supply lines including a first current-carrying line and a second current-carrying line, having an input end and an output end; and a leakage current detection module, including a first leakage current detection line, a second leakage current detection line, and at least one resistive element and/or at least one semiconductor element, configured to detect a leakage current signal on the first current-carrying line or the second current-carrying line and to generate a leakage fault signal in response to detecting the leakage current signal, wherein the first leakage current detection line and second leakage current detection line are electrically insulated from each other, and respectively cover one of the first current-carrying line and the second current-carrying line, and wherein the at least one resistive element and/or the at least one semiconductor element is coupled in series between the first leakage current detection line and the second leakage current detection line to form a current path, for detecting an open circuit fault in the leakage current detection module.

In some embodiments, each of the first and second leakage current detection lines has a first end and a second end, the first end being located closer to the input end than the second end is and the second end being located closer to the output end than the first end is, and wherein the first end of the first leakage current detection line is coupled to the second end of the second leakage current detection line via the at least one resistive element and/or at least one semiconductor element.

In some embodiments, each of the first and second leakage current detection lines has a first end and a second end, the first end being located closer to the input end than the second end is and the second end being located closer to the output end than the first end is, and wherein the first end of the first leakage current detection line is coupled to the second end of the second leakage current detection line via the at least one resistive element and/or at least one semiconductor element.

In some embodiments, each of the first and second leakage current detection lines has a first end and a second end, the first end being located closer to the input end than the second end is and the second end being located closer to the output end than the first end is, and wherein the second end of the first leakage current detection line is coupled to the first end of the second leakage current detection line via the at least one resistive element and/or at least one semiconductor element.

In some embodiments, each of the first and second leakage current detection lines has a first end and a second end, the first end being located closer to the input end than the second end is and the second end being located closer to the output end than the first end is, and wherein the first end of the first leakage current detection line is coupled to the first end of the second leakage current detection line via the at least one resistive element and/or at least one semiconductor element.

In some embodiments, the at least one resistive element includes a resistor, a capacitor, an inductor, or a conductor having a non-negligible resistance.

In some embodiments, the least one semiconductor element includes a diode, a bipolar transistor, a field-effect transistor, or a silicon controlled rectifier.

In some embodiments, the device further includes a detection monitoring module, coupled to the leakage current detection module, configured to detect an open circuit fault condition in the first leakage current detection line and the second leakage current detection lines by monitoring the current path, and to generate an open circuit fault signal in response to detecting the open circuit fault condition.

In some embodiments, the detection monitoring module includes at least one resistor and/or at least one diode.

In some embodiments, the device further includes: a switch module configured to control an electrical connection and disconnection between the input and output ends of the first and second current-carrying lines; and a drive module coupled to the leakage current detection module and/or the detection monitoring module, configured to drive the switch module to disconnect the electrical connection in response to the leakage fault signal and/or the open circuit fault signal.

In some embodiments, the device further includes an insulating structure covering at least one of the first leakage current detection line and the second leakage current detection line.

In some embodiments, the insulating structure is formed integrally of a plastic material or formed of an insulating paper or insulating fabric.

In some embodiments, the first leakage current detection line or the second leakage current detection line is formed of a sheet shaped single-sided insulating material which is electrically insulating on one side and electrically conductive on another side.

In some embodiments, the device further includes a test module, coupled to the leakage current detection module and including a manually operable test switch, configured to generate a simulated leakage current in the current path when the test switch is operated, to test the leakage current detection module.

In a second aspect, the present invention provides an electrical power connection device, which includes: a body; and a leakage current detection and interruption device according to any of the above embodiments, disposed inside the body.

In a third aspect, the present invention provides an electrical appliance, which includes: an electrical load; and an electrical power connection device coupled between a power supply and the electrical load, configured to supply power to the electrical load, wherein the electrical power connection device includes a leakage current detection and interruption device according to any of the above embodiments.

The LCDI device according to embodiments of the present invention can detect whether the leakage current detection lines has a fault, thereby improving the reliability of the LCDI device. The device has a simple structure, is low cost and safe.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Figure 1:
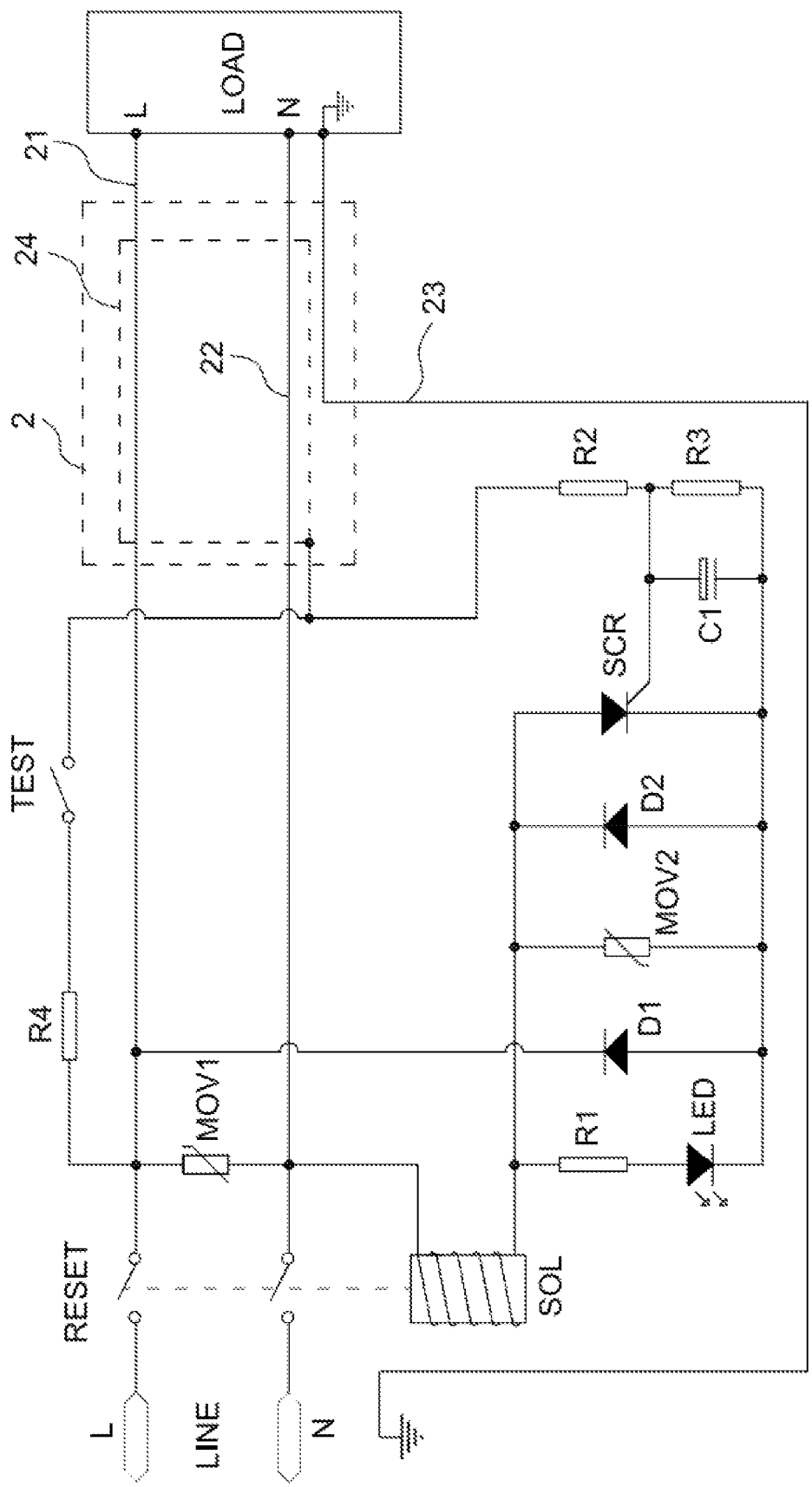
FIG. 1 is a circuit diagram illustrating a conventional LCDI device.

FIG. 1 is a circuit diagram illustrating a conventional LCDI device. As shown in FIG. 1, the power supply lines include a first current-carrying line (e.g., hot line L) 21, a second current-carrying line (e.g., neutral line N) 22, a third current-carrying line (e.g., ground line G) 23, and a leakage current detection line 24. When the leakage current detection line 24 has an open circuit and loses its detection and protection function, the LCDI device can still function to conduct power to the output end. This can cause fire or other safety hazard.

Embodiments of the present invention provide an LCDI device that can detect whether the leakage current detection line has a fault, thereby ensuring the reliability of the LCDI device.

Figure 2:
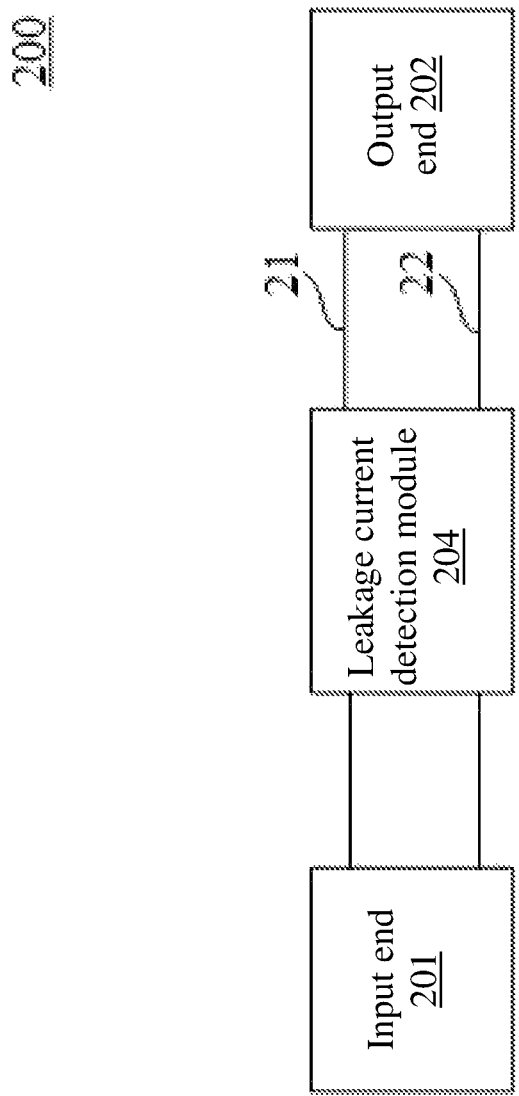
FIG. 2 is a block diagram of an LCDI device according to embodiments of the present invention.

FIG. 2 is a block diagram of an LCDI device according to embodiments of the present invention. As shown in FIG. 2, the LCDI device 200 includes a leakage current detection module 204. The leakage current detection module 204 is disposed between the input end 201 and output end 202 of the first and second current-carrying lines 21 and 22, and operates to detect a leakage current signal on the first and second current-carrying lines 21 and 22, and to generate a leakage fault signal when the leakage current signal is detected. The leakage current detection module 204 includes (not shown in FIG. 2) a first leakage current detection line, a second leakage current detection line, and at least one resistive element and/or at least one semiconductor element. More specifically, the leakage current detection line 24 may include more than one resistive element, more than one semiconductor element, or a combination of more than one resistive element and more than one semiconductor element. The resistive elements may be any one or more of a resistor, a capacitor, an inductor, and a conductor having a non-negligible resistance. The semiconductor elements may be any one or more of a diode, a bipolar transistor, a field-effect transistor, and a silicon controlled rectifier. For example, the leakage current detection module 204 may include one resistor and one transistor, or two resistors, or one inductor and one diode, or two diodes, one conductor wire and one transistor, etc. The first and second leakage current detection lines are electrically insulated from each other, and respectively cover at least the first and the second current-carrying lines. The at least one resistive element and/or at least one semiconductor element is coupled in series between the first and second leakage current detection lines to form a current path, which operates to detect whether the leakage current detection module 204 has a fault. The fault in the leakage current detection module 204 may be, for example, an open circuit fault of the first leakage current detection line and/or the second leakage current detection line. The LCDI device 200 can detect the fault in the leakage current detection lines, thereby improving the reliability of the device. It has a simple circuit structure, is low cost, and enhances safety.

In some embodiments, at least one of the first and second leakage current detection lines is covered on its outside by an insulating structure, so that the first and second leakage current detection lines are electrically insulated from each other. The insulating structure may be formed integrally of a plastic material, covering the outside of the first and/or second leakage current detection line. Or, the insulating structure may be an insulating paper, insulating fabric or other suitable insulating materials, covering the outside of the first and/or second leakage current detection line. In other embodiments, a separate insulating structure is not used, but the first and/or second leakage current detection line is formed using a sheet shaped single-sided insulating material, i.e., a sheet material that is electrically insulating on one side (e.g., the outside) and electrically conductive on the other side, to achieve the electrical insulation between the first and second leakage current detection lines.

In some embodiments, the LCDI device 200 further includes a detection monitoring module (not shown in FIG. 2). The detection monitoring module is coupled to the leakage current detection module, and detects the open circuit fault condition in the first and second leakage current detection line by monitoring the current path formed by the first leakage current detection line, the at least one resistive element and/or semiconductor element, and the second leakage current detection line. The detection monitoring module generates an open circuit fault signal when the open circuit fault condition is detected. The detection monitoring module may include at least one resistor and/or at least one diode.

In some embodiments, the LCDI device 200 further includes a switch module and a drive module (not shown in FIG. 2). The switch module controls the electrical connection and disconnection between the input and output ends of the first and second current-carrying lines. The drive module is coupled to the leakage current detection module 204 and/or the detection monitoring module, and operates to drive the switch module to disconnect the electrical connection in response to the leakage fault signal and/or the open circuit fault signal, which further improves the reliability of the LCDI device 200.

In some embodiments, the LCDI device 200 further includes a test module (not shown in FIG. 2). The test module is coupled to the leakage current detection module 204 and includes a test switch. When the test switch is operated (e.g. manually operated by the user), the test module generates a simulated leakage current in the current path formed by the first leakage current detection line, the at least one resistive element and/or semiconductor element, and the second leakage current detection line, to test whether the LCDI device 200 is functioning properly. This further improves the reliability of the LCDI device 200.

Figure 3:
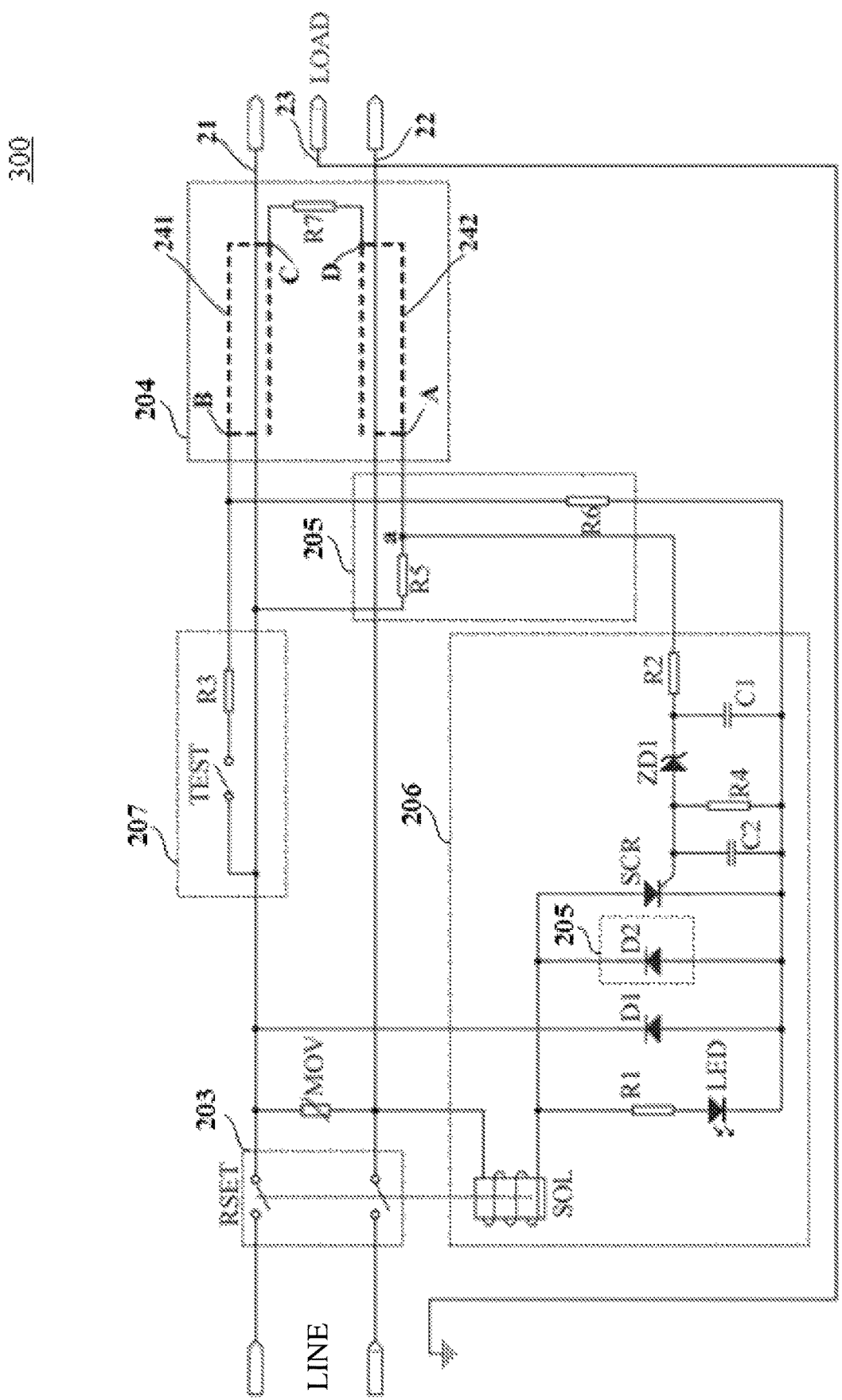
FIG. 3 is a circuit diagram of an LCDI device according to a first embodiment of the present invention.

FIG. 3 is a circuit diagram of an LCDI device according to a first embodiment of the present invention. As shown in FIG. 3, the LCDI device 300 includes a switch module 203, a leakage current detection module 204, a detection monitoring module 205, a drive module 206, and a test module 207. The power supply lines include a first current-carrying line 21, a second current-carrying line 22 and a ground line 23.

The switch module 203 includes a reset switch RESET, which controls the electrical connection and disconnection between the input end LINE and output end LOAD of the first and second current-carrying lines 21 and 22. The leakage current detection module 204 includes a first leakage current detection line 241, a second leakage current detection line 242, and a resistor R7 coupled in series between the first and second leakage current detection lines 241 and 242. In the illustrated embodiment, a first end B of the leakage current detection line 24 and a first end A of the second leakage current detection line 242 are the ends closer to the input end LINE one the left of FIG. 3; a second end C of the first leakage current detection line 241 and a second end D of the second leakage current detection line 242 are the ends closer to the output end LOAD one the right of FIG. 3.

As shown in FIG. 3, the first leakage current detection line 241, resistor R7 and second leakage current detection line 242 are coupled in series. More specifically, the first end B of the first leakage current detection line 241 is coupled to one end of a resistor R3 of the test module 207 and to one end of a resistor R6 of the detection monitoring module 205; the second end C of the first leakage current detection line 241 is coupled to the second end of the second leakage current detection line 242 via the resistor R7; and the first end A of the second leakage current detection line 242 is coupled to one end of a resistor R5 of the detection monitoring module 205 and to one end of a resistor R2 of the drive module 206. The other end of resistor R5 is coupled to the first current-carrying line 21 and to the reset switch RESET of the switch module 203. The other end of resistor R6 is coupled to the cathode of a silicon controlled rectifier SCR of the drive module 206. The drive module 206 further includes capacitors C1 and C2, voltage regulator (Zener diode) ZD1, resistors R1, R2 and R4, diodes D1 and D2, and light-emitting diode LED. Capacitor C2 and resistor R4 are coupled in parallel and then coupled to the anode of the Zener diode ZD1 and the control electrode of the silicon controlled rectifier SCR. The cathode of the Zener diode ZD1 is coupled to the other end of resistor R2 and to capacitor C1. The anode of the silicon controlled rectifier SCR is coupled to one end of a solenoid SOL, and the other end of the solenoid SOL is coupled to the second current-carrying line 22 and the reset switch RESET. The anode of diode D1 is coupled to the cathode of the silicon controlled rectifier SCR, and the cathode of diode D1 is coupled to the second current-carrying line 21 and the reset switch RESET. Diode D2 is shared by the detection monitoring module 205 and drive module 206; its anode is coupled to the cathode of the silicon controlled rectifier SCR and its cathode is coupled to the anode of the silicon controlled rectifier SCR.

The test module 207 includes resistor R3 and test switch TEST coupled in series. The test switch TEST is coupled to the first current-carrying line 21 and the reset switch RESET. In this embodiment, the first current-carrying line 21, test switch TEST, resistor R3, first leakage current detection line 241, resistor R7, second leakage current detection line 242, resistor R2, Zener diode ZD1, resistor R4, diode D2, solenoid SOL and second current-carrying line 22 form a test current path.

When the LCDI device 300 is operating normally, a current flows through the current path formed by 21-R5-242-R7-241-R6-D2-SOL-22. By setting the resistance values of resistors R5, R6 and R7, the voltage at the point a (same as the point A) is controlled at a relatively low voltage level, e.g., below the threshold voltage of the Zener diode ZD1; as a result, the voltage at the control electrode of the silicon controlled rectifier SCR is at a very low level, and the silicon controlled rectifier SCR is not triggered (not conductive). Therefore, the switch module 203 is in the close (conductive) state, and the LCDI device 300 operates normally.

When the first current-carrying line 21 has a leakage fault (i.e., a leakage current signal is present on the first current-carrying line 21), the first leakage current detection line 241 is electrified, causing the voltage at point a to rise. When the leakage current signal on the first current-carrying line 21 is above a preset threshold, a current (the leakage fault signal) flows through the path formed by 21-241-R7-242-R2-ZD1, triggering the silicon controlled rectifier SCR to become conductive. When the silicon controlled rectifier SCR is conductive, a trip current path is formed by 22-SOL-SCR-D1-21. The current through the solenoid SOL generates a sufficiently large magnetic field, causing the reset switch RESET to trip, thereby disconnecting the electrical connection between the input end LINE and the output end LOAD.

When the second current-carrying line 22 has a leakage fault (i.e., a leakage current signal is present on the first current-carrying line 22), the second leakage current detection line 242 is electrified, causing the voltage at point a to rise. When the leakage current signal on the second current-carrying line 22 is above a preset threshold, a current (the leakage fault signal) flows through the path formed by 22-242-R2-ZD1, which triggers the silicon controlled rectifier SCR to become conductive. When the silicon controlled rectifier SCR is conductive, a above-described trip current path is formed. The current through the solenoid SOL generates a sufficiently large magnetic field, causing the reset switch RESET to trip, thereby disconnecting the electrical connection between the input end LINE and the output end LOAD.

When either one of the first and second leakage current detection lines 241 and 242 has an open circuit condition, or both have open circuit conditions, resistors R6, R7 lose their voltage-dividing function, so the voltage at point a rises, and a current (the open circuit fault signal) flows through the path formed by 21-R5-R2-ZD1, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

The LCDI device 300 further has a test function, i.e., the test module 207 can be used to test whether the leakage current detection module 204 is faulty. When the test switch TEST is closed (e.g., manually closed by a user), the test current path is a closed current path, and a current (the simulated leakage fault signal) flows through the path formed by 21-TEST-R3-241-R7-242-R2-ZD1-R4-D2-SOL-22. This current causes the voltage across resistor R4 to rise, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

When either one of the first and second leakage current detection lines 241 and 242 has an open circuit condition, or both have open circuit conditions, and when the test switch TEST is closed at this time, the test current path does not form a closed current path, and no current flows through it. Therefore, the silicon controlled rectifier SCR is not triggered, and the reset switch RESET does not trip. This result indicates to the user that at least one of the first and second leakage current detection lines 241 and 242 has an open circuit. This way, the user can operate the test switch TEST to test whether the first and second leakage current detection lines 241 and 242 are intact. It should be noted that in addition to fault in the leakage current detection module 204, the test module 207 may be operated to test for open circuit faults of other elements of the test current path.

Figure 4:
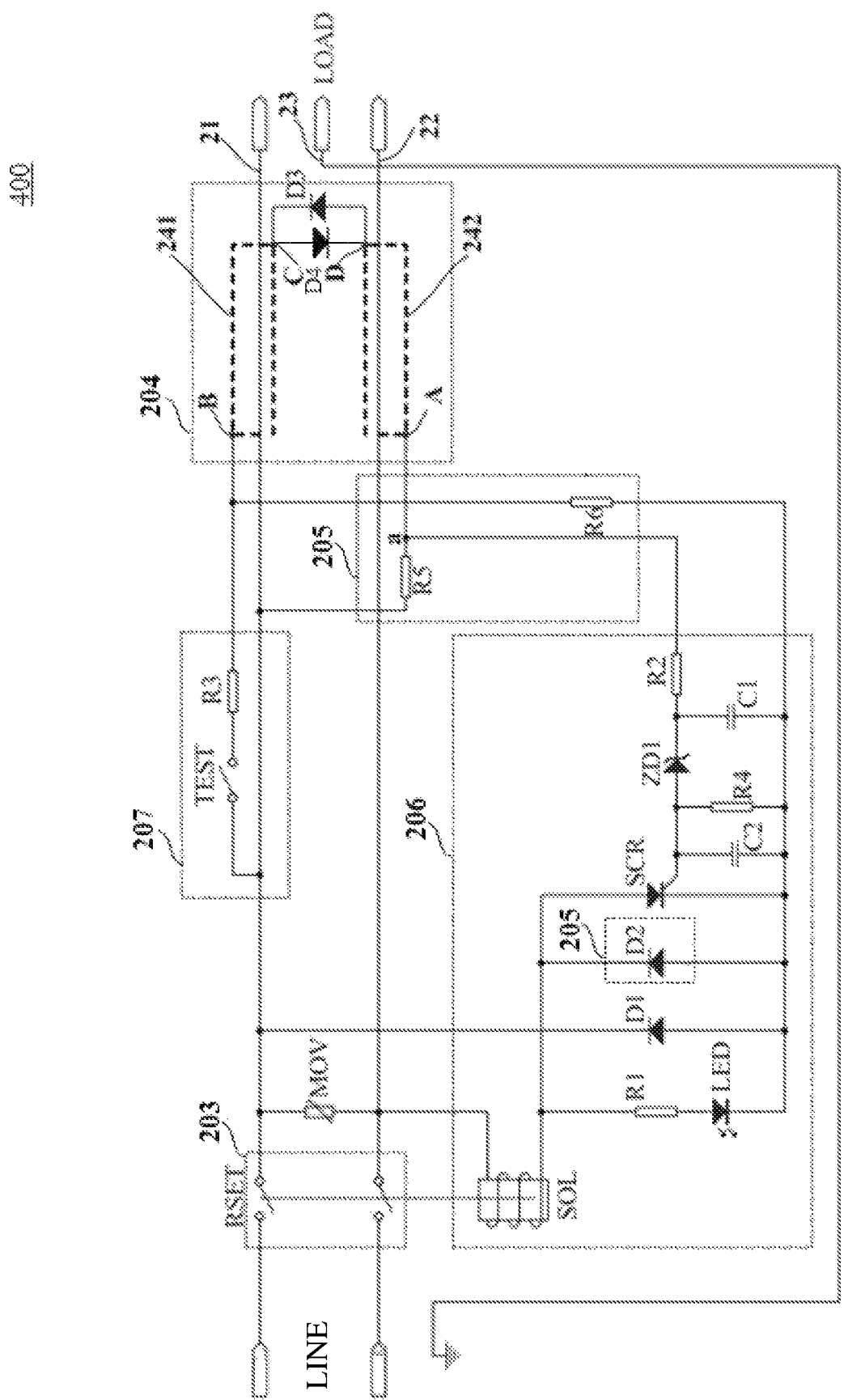
FIG. 4 is a circuit diagram of an LCDI device according to a second embodiment of the present invention.

FIG. 4 is a circuit diagram of an LCDI device 400 according to a second embodiment of the present invention. Compared to the embodiment of FIG. 3, one difference is that in the leakage current detection module 204 of FIG. 4, diodes D3 and D4 replace the resistor R7 in FIG. 3.

In the LCDI device 400, the anode of diode D3 is coupled to the cathode of diode D4, and coupled to the second end D of the second leakage current detection line 242; the cathode of diode D3 is coupled to the anode of diode D4, and coupled to the second end C of the first leakage current detection line 241.

When the LCDI device 400 is operating normally, a current flows through the current path formed by 21-R5-242-D3-241-R6-D2-SOL-22. By setting the resistance values of resistors R5 and R6, the voltage at the point a is controlled at a relatively low voltage level, e.g., below the threshold voltage of the Zener diode ZD1; as a result, the voltage at the control electrode of the silicon controlled rectifier SCR is at a very low level, and the silicon controlled rectifier SCR is not triggered. Therefore, the switch module 203 is in the close state, and the LCDI device 400 operates normally.

When the first current-carrying line 21 has a leakage fault, the first leakage current detection line 241 is electrified, causing the voltage at point a to rise. When the leakage current signal on the first current-carrying line 21 is above a preset threshold, a current (the leakage fault signal) flows through the path formed by 21-241-D4-242-R2-ZD1, triggering the silicon controlled rectifier SCR to become conductive. When the silicon controlled rectifier SCR is conductive, a trip current path is formed by 22-SOL-SCR-D1-21. The current through the solenoid SOL generates a sufficiently large magnetic field, causing the reset switch RESET to trip, thereby disconnecting the electrical connection between the input end LINE and the output end LOAD.

When the second current-carrying line 22 has a leakage fault, the second leakage current detection line 242 is electrified, causing the voltage at point a to rise. When the leakage current signal on the second current-carrying line 22 is above a preset threshold, a current (the leakage fault signal) flows through the path formed by 22-242-R2-ZD1, which triggers the silicon controlled rectifier SCR to become conductive. When the silicon controlled rectifier SCR is conductive, a above-described trip current path is formed. The current through the solenoid SOL generates a sufficiently large magnetic field, causing the reset switch RESET to trip, thereby disconnecting the electrical connection between the input end LINE and the output end LOAD.

When either one of the first and second leakage current detection lines 241 and 242 has an open circuit condition, or both have open circuit conditions, the voltage at point a rises, and a current (the open circuit fault signal) flows through the path formed by 21-R5-R2-ZD1, triggering the silicon controlled rectifier SCR to become conductive.

When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

The LCDI device 400 further has a test function, i.e., the test module 207 can be used to test whether the leakage current detection module 204 is faulty. When the test switch TEST is closed (e.g., manually closed by a user), the test current path is a closed current path, and a current (the simulated leakage fault signal) flows through the path formed by 21-TEST-R3-241-D4-242-R2-ZD1-R4-D2-SOL-22. This current causes the voltage across resistor R4 to rise, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

When either one of the first and second leakage current detection lines 241 and 242 has an open circuit condition, or both have open circuit conditions, and when the test switch TEST is closed at this time, the test current path does not form a closed current path, and no current flows through it. Therefore, the silicon controlled rectifier SCR is not triggered, and the reset switch RESET does not trip. This result indicates to the user that at least one of the first and second leakage current detection lines 241 and 242 has an open circuit. This way, the user can operate the test switch TEST to test whether the first and second leakage current detection lines 241 and 242 are intact. It should be noted that in addition to fault in the leakage current detection module 204, the test module 207 may be operated to test for open circuit faults of other elements of the test current path.

Figure 5:
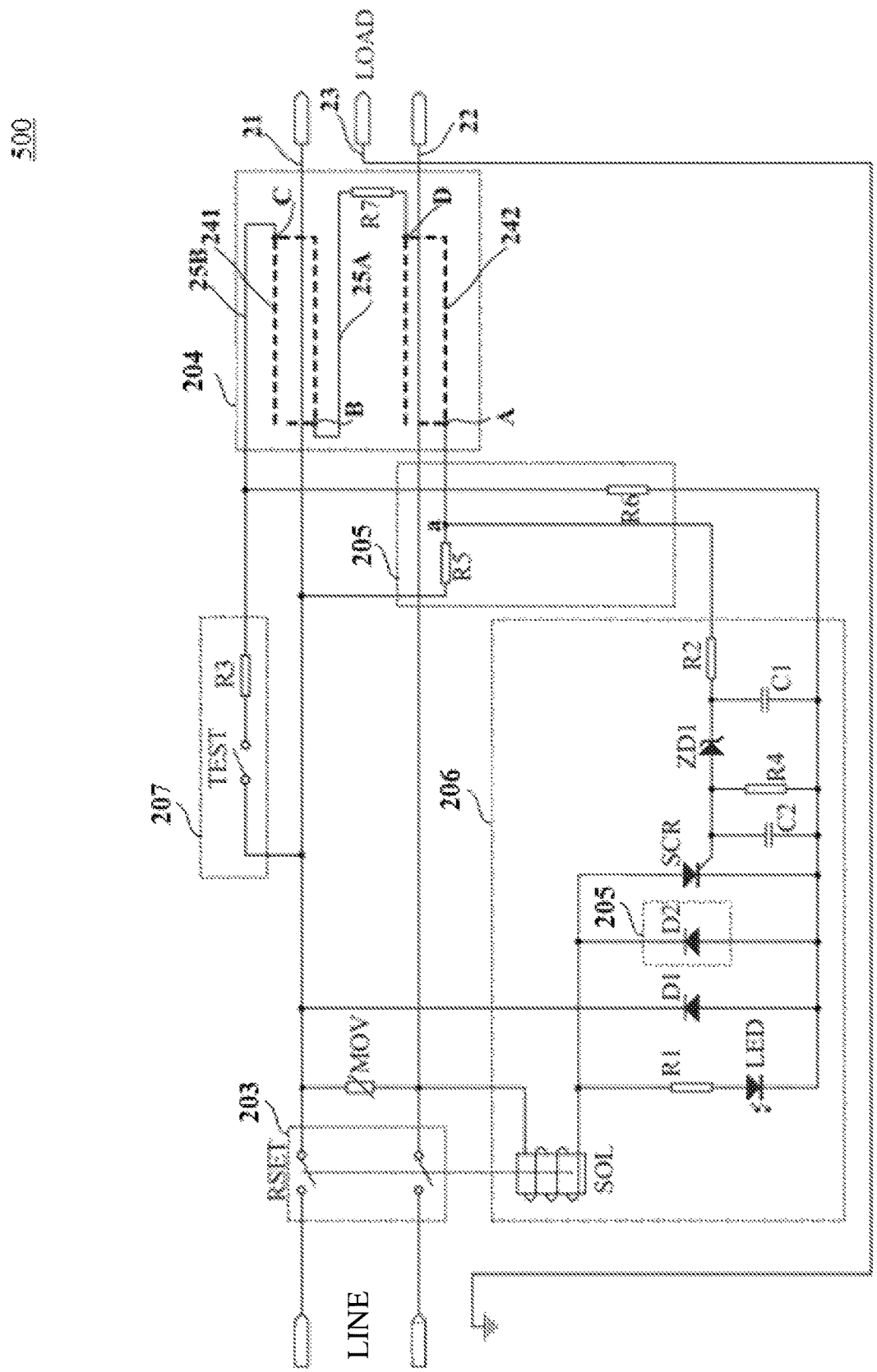
FIG. 5 is a circuit diagram of an LCDI device according to a third embodiment of the present invention.

FIG. 5 is a circuit diagram of an LCDI device 500 according to a third embodiment of the present invention. Compared to the embodiment of FIG. 3, one difference is that the leakage current detection module 204 of FIG. 5 further includes a first signal line 25A and a second signal line 25B. The first signal line 25A is coupled at one end to the first end B of the first leakage current detection line 241, and at the other end to resistor R7; the second signal line 25B is coupled at one end to one end of resistors R3 and R6, and at the other end to the second end C of the second leakage current detection line 242.

When the LCDI device 500 is operating normally, a current flows through the current path formed by 21-R5-242-R7-25A-241-25B-R6-D2-SOL-22. By setting the resistance values of resistors R5, R6 and R7, the voltage at the point a is controlled at a relatively low voltage level, e.g., below the threshold voltage of the Zener diode ZD1; as a result, the voltage at the control electrode of the silicon controlled rectifier SCR is at a very low level, and the silicon controlled rectifier SCR is not triggered. Therefore, the switch module 203 is in the close state, and the LCDI device 500 operates normally.

When the first current-carrying line 21 has a leakage fault, the first leakage current detection line 241 is electrified, causing the voltage at point a to rise. When the leakage current signal on the first current-carrying line 21 is above a preset threshold, a current (the leakage fault signal) flows through the path formed by 21-241-25A-R7-242-R2-ZD1, triggering the silicon controlled rectifier SCR to become conductive. When the silicon controlled rectifier SCR is conductive, a trip current path is formed by 22-SOL-SCR-D1-21. The current through the solenoid SOL generates a sufficiently large magnetic field, causing the reset switch RESET to trip, thereby disconnecting the electrical connection between the input end LINE and the output end LOAD.

When the second current-carrying line 22 has a leakage fault, the second leakage current detection line 242 is electrified, causing the voltage at point a to rise. When the leakage current signal on the second current-carrying line 22 is above a preset threshold, a current (the leakage fault signal) flows through the path formed by 22-242-R2-ZD1, which triggers the silicon controlled rectifier SCR to become conductive. When the silicon controlled rectifier SCR is conductive, a above-described trip current path is formed. The current through the solenoid SOL generates a sufficiently large magnetic field, causing the reset switch RESET to trip, thereby disconnecting the electrical connection between the input end LINE and the output end LOAD.

When any one or more of the first and second leakage current detection lines 241 and 242 and the first and second signal lines 25A and 25B has an open circuit condition, resistors R6, R7 lose their voltage-dividing function, so the voltage at point a rises, and a current (the open circuit fault signal) flows through the path formed by 21-R5-R2-ZD1, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

The LCDI device 500 further has a test function, i.e., the test module 207 can be used to test whether the leakage current detection module 204 is faulty. When the test switch TEST is closed (e.g., manually closed by a user), the test current path is a closed current path, and a current (the simulated leakage fault signal) flows through the path formed by 21-TEST-R3-25B-241-25A-R7-242-R2-ZD1-R4-D2-SOL-22. This current causes the voltage across resistor R4 to rise, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

When any one or more of the first and second leakage current detection lines 241 and 242 and the first and second signal lines 25A and 25B has an open circuit condition, and when the test switch TEST is closed at this time, the test current path does not form a closed current path, and no current flows through it. Therefore, the silicon controlled rectifier SCR is not triggered, and the reset switch RESET does not trip. This result indicates to the user that at least one of the first and second leakage current detection lines 241 and 242 and the first and second signal lines 25A and 25B has an open circuit. This way, the user can operate the test switch TEST to test whether the first and second leakage current detection lines 241 and 242 and the first and second signal lines 25A and 25B are intact. It should be noted that in addition to fault in the leakage current detection module 204, the test module 207 may be operated to test for open circuit faults of other elements of the test current path.

Figure 6:
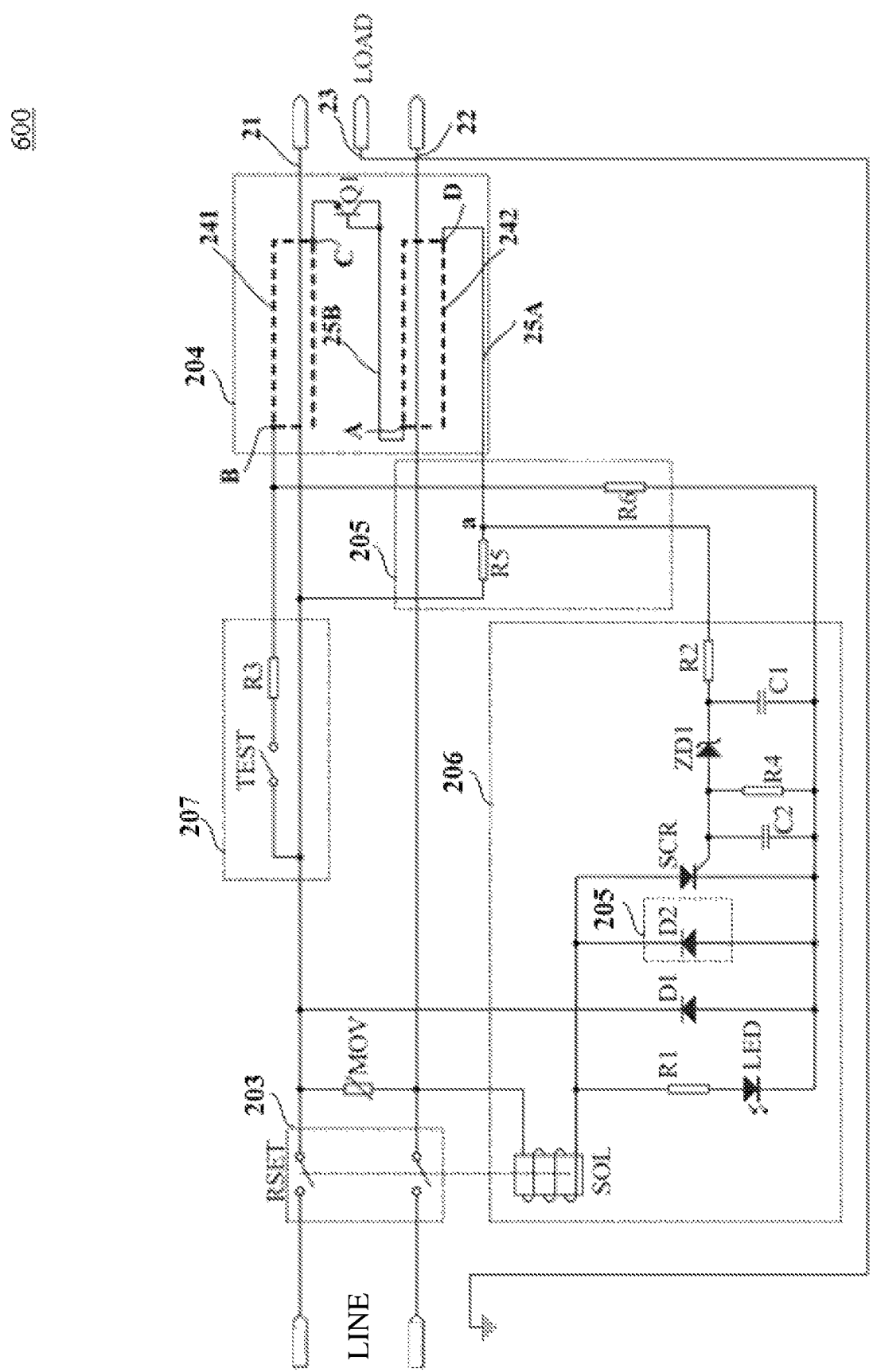
FIG. 6 is a circuit diagram of an LCDI device according to a fourth embodiment of the present invention.

FIG. 6 is a circuit diagram of an LCDI device 600 according to a fourth embodiment of the present invention. Compared to the embodiment of FIG. 3, one difference is that the leakage current detection module 204 of FIG. 6 further includes a first signal line 25A and a second signal line 25B, and that a bipolar transistor Q1 (an NPN transistor in this example) replaces the resistor R7 in FIG. 3. The first signal line 25A is coupled at one end to one end of resistors R5 and R2, and at the other end to the second end D of the second leakage current detection line 242; the second signal line 25B is coupled at one end to the first end A of the second leakage current detection line 242, and at the other end to the emitter of transistor Q1; the collector of the transistor Q1 is coupled to the second end C of the first leakage current detection line 241.

When the LCDI device 600 is operating normally, a current flows through the current path formed by 21-R5-25A-242-25B-Q1-241-R6-D2-SOL-22. By setting the resistance values of resistors R5 and R6, the voltage at the point a is controlled at a relatively low voltage level, e.g., below the threshold voltage of the Zener diode ZD1; as a result, the voltage at the control electrode of the silicon controlled rectifier SCR is at a very low level, and the silicon controlled rectifier SCR is not triggered. Therefore, the switch module 203 is in the close state, and the LCDI device 600 operates normally.

When the first current-carrying line 21 has a leakage fault, the first leakage current detection line 241 is electrified, causing the voltage at point a to rise. When the leakage current signal on the first current-carrying line 21 is above a preset threshold, a current (the leakage fault signal) flows through the path formed by 21-241-Q1-25B-242-25A-R2-ZD1, triggering the silicon controlled rectifier SCR to become conductive. When the silicon controlled rectifier SCR is conductive, a trip current path is formed by 22-SOL-SCR-D1-21. The current through the solenoid SOL generates a sufficiently large magnetic field, causing the reset switch RESET to trip, thereby disconnecting the electrical connection between the input end LINE and the output end LOAD.

When the second current-carrying line 22 has a leakage fault, the second leakage current detection line 242 is electrified, causing the voltage at point a to rise. When the leakage current signal on the second current-carrying line 22 is above a preset threshold, a current (the leakage fault signal) flows through the path formed by 22-242-25A-R2-ZD1, which triggers the silicon controlled rectifier SCR to become conductive. When the silicon controlled rectifier SCR is conductive, a above-described trip current path is formed. The current through the solenoid SOL generates a sufficiently large magnetic field, causing the reset switch RESET to trip, thereby disconnecting the electrical connection between the input end LINE and the output end LOAD.

When any one or more of the first and second leakage current detection lines 241 and 242 and the first and second signal lines 25A and 25B has an open circuit condition, the voltage at point a rises, and a current (the open circuit fault signal) flows through the path formed by 21-R5-R2-ZD1, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

The LCDI device 600 further has a test function, i.e., the test module 207 can be used to test whether the leakage current detection module 204 is faulty. When the test switch TEST is closed (e.g., manually closed by a user), the test current path is a closed current path, and a current (the simulated leakage fault signal) flows through the path formed by 21-TEST-R3-241-25B-242-25A-R2-ZD1-R4-D2-SOL-22. This current causes the voltage across resistor R4 to rise, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

When any one or more of the first and second leakage current detection lines 241 and 242 and the first and second signal lines 25A and 25B has an open circuit condition, and when the test switch TEST is closed at this time, the test current path does not form a closed current path, and no current flows through it. Therefore, the silicon controlled rectifier SCR is not triggered, and the reset switch RESET does not trip. This result indicates to the user that at least one of the first and second leakage current detection lines 241 and 242 and the first and second signal lines 25A and 25B has an open circuit. This way, the user can operate the test switch TEST to test whether the first and second leakage current detection lines 241 and 242 and the first and second signal lines 25A and 25B are intact. It should be noted that in addition to fault in the leakage current detection module 204, the test module 207 may be operated to test for open circuit faults of other elements of the test current path.

Figure 7:
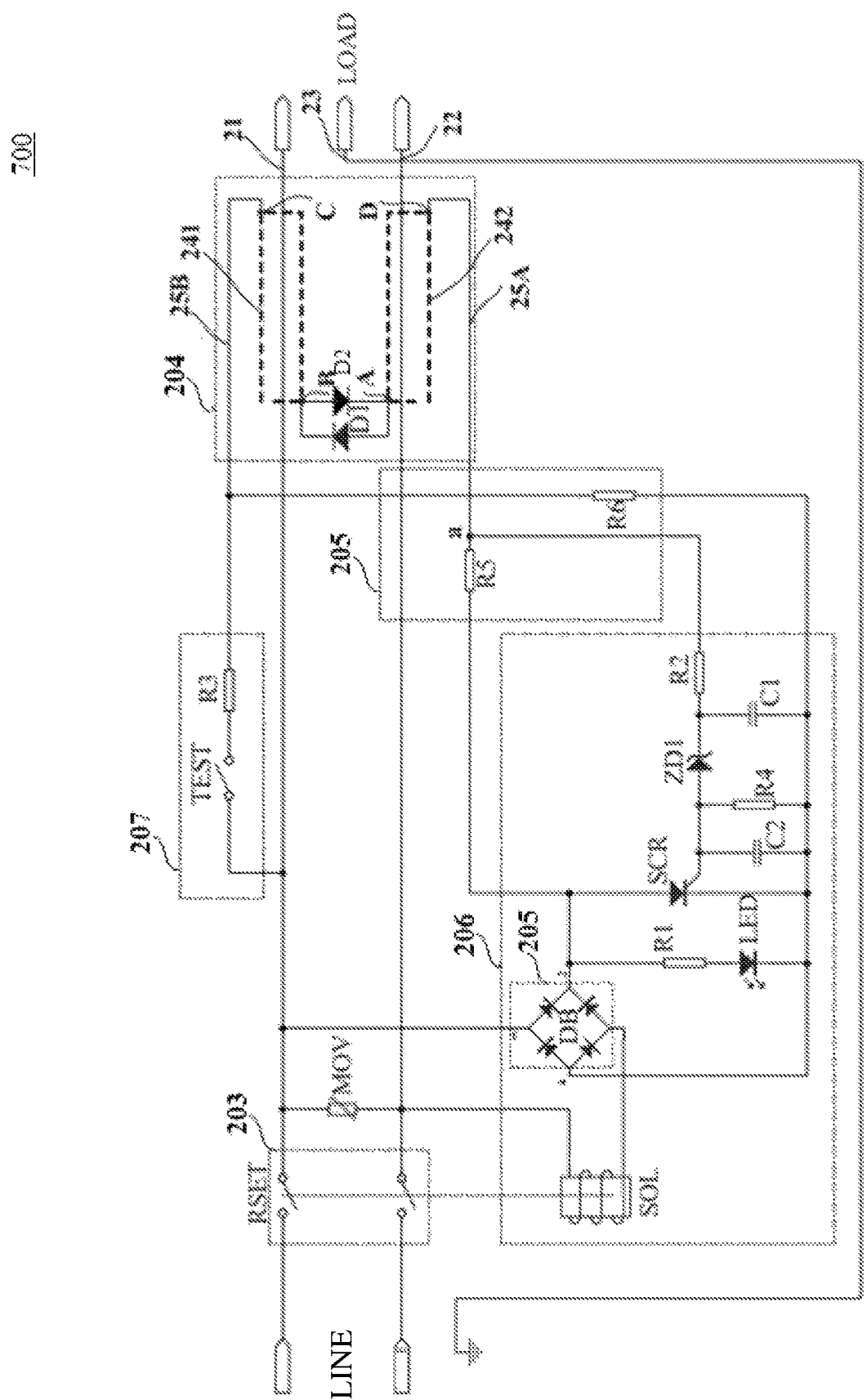
FIG. 7 is a circuit diagram of an LCDI device according to a fifth embodiment of the present invention.

FIG. 7 is a circuit diagram of an LCDI device 700 according to a fifth embodiment of the present invention. Compared to the embodiment of FIG. 3, one difference is that the leakage current detection module 204 of FIG. 7 further includes a first signal line 25A and a second signal line 25B, and that diodes D1 and D2 replace the resistor R7 in FIG. 3. Further, the drive module 206 of FIG. 7 employs a full-bridge rectifier DB that replaces diodes D1 and D2 in FIG. 3.

In the LCDI device 700, the second signal line 25B is coupled at one end to one end of resistor R3, and at the other end to the second end C of the first leakage current detection line 241; the anode of diode D1 is coupled to the cathode of diode D2, and coupled to the first end A of the second leakage current detection line 242; the cathode of diode D1 is coupled to the anode of diode D2, and coupled to the first end B of the first leakage current detection line 241; the first signal line 25A is coupled at one end to one end of resistors R5 and R2, and at the other end to the second end D of the second leakage current detection line 242.

When the LCDI device 700 is operating normally, a current flows through the current path formed by 21-DB-R5-25A-242-D1-241-25B-R6-DB-SOL-22. By setting the resistance values of resistors R5 and R6, the voltage at the point a is controlled at a relatively low voltage level, e.g., below the threshold voltage of the Zener diode ZD1; as a result, the voltage at the control electrode of the silicon controlled rectifier SCR is at a very low level, and the silicon controlled rectifier SCR is not triggered. Therefore, the switch module 203 is in the close state, and the LCDI device 700 operates normally.

When the first current-carrying line 21 has a leakage fault, the first leakage current detection line 241 is electrified, causing the voltage at point a to rise. When the leakage current signal on the first current-carrying line 21 is above a preset threshold, a current (the leakage fault signal) flows through the path formed by 21-241-D2-242-25A-R2-ZD1, triggering the silicon controlled rectifier SCR to become conductive. When the silicon controlled rectifier SCR is conductive, a trip current path is formed by 22-SOL-DB-SCR-DB-21. The current through the solenoid SOL generates a sufficiently large magnetic field, causing the reset switch RESET to trip, thereby disconnecting the electrical connection between the input end LINE and the output end LOAD.

When the second current-carrying line 22 has a leakage fault, the second leakage current detection line 242 is electrified, causing the voltage at point a to rise. When the leakage current signal on the second current-carrying line 22 is above a preset threshold, a current (the leakage fault signal) flows through the path formed by 22-242-25A-R2-ZD1, which triggers the silicon controlled rectifier SCR to become conductive. When the silicon controlled rectifier SCR is conductive, a above-described trip current path is formed. The current through the solenoid SOL generates a sufficiently large magnetic field, causing the reset switch RESET to trip, thereby disconnecting the electrical connection between the input end LINE and the output end LOAD.

When any one or more of the first and second leakage current detection lines 241 and 242 and the first and second signal lines 25A and 25B has an open circuit condition, the voltage at point a rises, and a current (the open circuit fault signal) flows through the path formed by 21-DB-R5-R2-ZD1, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

The LCDI device 700 further has a test function, i.e., the test module 207 can be used to test whether the leakage current detection module 204 is faulty. When the test switch TEST is closed (e.g., manually closed by a user), the test current path is a closed current path, and a current (the simulated leakage fault signal) flows through the path formed by 21-TEST-R3-25B-241-D2-242-25A-R2-ZD1-R4-DB-SOL-22. This current causes the voltage across resistor R4 to rise, triggering the silicon controlled rectifier SCR to become conductive. When the silicon controlled rectifier SCR is conductive, the above-described trip current path is formed; the current through the solenoid SOL generates a sufficiently large magnetic field, causing the reset switch RESET to trip, thereby disconnecting the electrical connection between the input end LINE and the output end LOAD.

When any one or more of the first and second leakage current detection lines 241 and 242 and the first and second signal lines 25A and 25B has an open circuit condition, and when the test switch TEST is closed at this time, the test current path does not form a closed current path, and no current flows through it. Therefore, the silicon controlled rectifier SCR is not triggered, and the reset switch RESET does not trip. This result indicates to the user that at least one of the first and second leakage current detection lines 241 and 242 and the first and second signal lines 25A and 25B has an open circuit. This way, the user can operate the test switch TEST to test whether the first and second leakage current detection lines 241 and 242 and the first and second signal lines 25A and 25B are intact. It should be noted that in addition to fault in the leakage current detection module 204, the test module 207 may be operated to test for open circuit faults of other elements of the test current path.

Figure 8:
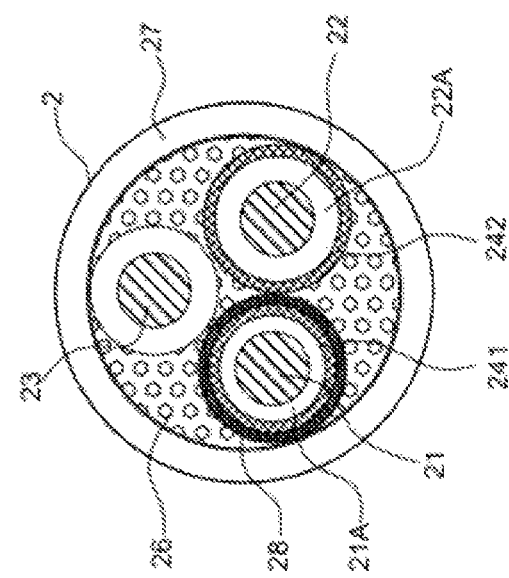
FIG. 8 is a cross-sectional view of a power cord according to an embodiment of the present invention.

FIG. 8 is a cross-sectional view of a power cord 2 according to an embodiment of the present invention. As shown in FIG. 8, the power cord 2 includes a first current-carrying line (e.g., hot line L) 21, a second current-carrying line (e.g. neutral line N) 22, a third current-carrying line (e.g., ground line G) 23, a first leakage current detection line 241, a second leakage current detection line 242, and an insulating outer cover 27.

In the embodiment shown in FIG. 8, the exterior shape of the power cord 2 is round in the cross-sectional view. The first current-carrying line 21, second current-carrying line 22, and third current-carrying line 23 are respectively covered by insulating layers, such as insulating layers 21A and 22A. It should be understood that the exterior shape of the power cord 2 may be an elongated shape where the current-carrying lines are arranged side-by-side, or other shapes. As shown in FIG. 8, the power cord 2 may further include a filler material 26. The first leakage current detection line 241 covers the insulating layer 21A of the first current-carrying line 21, and the second leakage current detection line 242 covers the insulating layer 22A of the second current-carrying line 22. An insulating structure 28 covers the first leakage current detection line 241. The insulating structure 28 may be formed integrally of a plastic material, or formed by covering the various components using insulating paper, insulating fabric, or other materials that meet the insulation requirements. In some embodiment, the first leakage current detection line 241 and the second leakage current detection line 242 may be respectively covered by insulating materials on their outsides; or, one of the first and second leakage current detection lines 241, 242 may be covered with an insulating structure, while the other one is not covered by an insulating material. Each of the first and second leakage current detection lines 241 and 242 may be a metal (e.g., copper, aluminum) woven structure, or a wound structure made from at least one metal wire, or a metal foil covering the current-carrying lines, or suitable combinations thereof. In some embodiment, each of the first and second leakage current detection lines 241 and 242 may be formed of a single-sided insulating material, i.e. material that is conductive on one side and insulating on the other sides; the insulating side serves as the insulating structure, without using a separate insulating structure.

Figure 9:
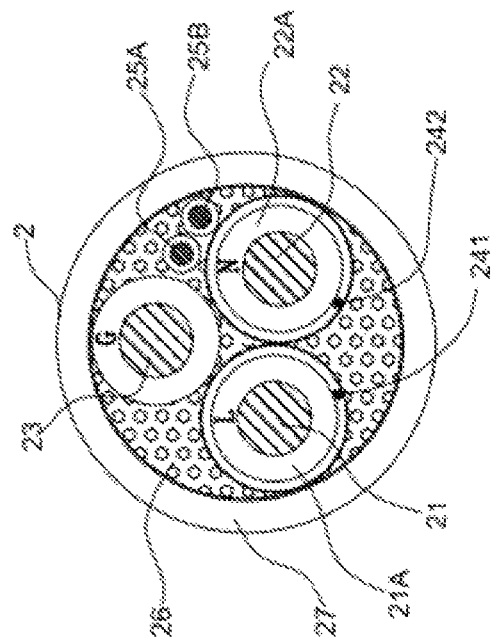
FIG. 9 is a cross-sectional view of a power cord according to another embodiment of the present invention.

FIG. 9 is a cross-sectional view of a power cord according to another embodiment of the present invention. As shown in FIG. 9, the power cord 2 includes a first current-carrying line (e.g., hot line L) 21, a second current-carrying line (e.g. neutral line N) 22, a third current-carrying line (e.g., ground line G) 23, a first leakage current detection line 241, a second leakage current detection line 242, a first signal line 25A, a second signal line 25B, and an insulating outer cover 27. In the example shown in FIG. 9, the first signal line 25A and second signal line 25B are located on the same side of the third current-carrying line 23, but they may be located at any suitable locations, and the invention is not limited to any particular arrangement.

In the embodiment shown in FIG. 9, the exterior shape of the power cord 2 is round in the cross-sectional view. The first current-carrying line 21, second current-carrying line 22, and third current-carrying line 23 are respectively covered by insulating layers, such as insulating layers 21A and 22A. It should be understood that the exterior shape of the power cord 2 may be an elongated shape where the current-carrying lines are arranged side-by-side, or other shapes. As shown in FIG. 9, the power cord 2 may further include a filler material 26. The first leakage current detection line 241 covers the insulating layer 21A of the first current-carrying line 21, and the second leakage current detection line 242 covers the insulating layer 22A of the second current-carrying line 22. Each of the first and second leakage current detection lines 241 and 242 may be formed of a single-sided insulating material, i.e. material that is conductive on one side and insulating on the other sides; the insulating side serves as the insulating structure, so a separate insulating structure is not needed. In some embodiments (not shown in FIG. 9), the first leakage current detection line 241 and the second leakage current detection line 242 may be respectively covered by an insulating material on their outsides; or, one of the first and second leakage current detection lines 241, 242 may be covered by an insulating structure, while the other one is not covered by an insulating material. The insulating structure (similar to structure 28 in FIG. 8) may be formed integrally of a plastic material, or formed by covering the various components using insulating paper, insulating fabric, or other materials that meet the insulation requirements. Each of the first and second leakage current detection lines 241 and 242 may be a metal (e.g., copper, aluminum) woven structure, or a wound structure made from at least one metal wire, or a metal foil covering the current-carrying lines, or suitable combinations thereof.

In the above embodiments, by detecting whether the leakage current detection lines are faulty, the reliability of the LCDI device is improved. Further, the LCDI devices according to embodiments of the present invention have a simple circuit structure, is low cost, and safe.

Some additional embodiments of the present invention provide an electrical power connection device, which includes a body and a leakage current detection and protection device according to any one of the above embodiments disposed inside the body.

Other additional embodiments of the present invention provide an electrical appliance, which includes an electrical load, and an electrical power connection device coupled between a power supply and the load to supply power to the load, where the electrical power connection device employs a leakage current detection and protection device according to any one of the above embodiments.

While the present invention is described above using specific examples, these examples are only illustrative and do not limit the scope of the invention. It will be apparent to those skilled in the art that various modifications, additions and deletions can be made to the LCDI device of the present invention without departing from the spirit or scope of the invention.

The invention claimed is:

1. A leakage current detection and interruption device, comprising:
   power supply lines including a first current-carrying line and a second current-carrying line, having an input end and an output end; and
   a leakage current detection module, including a first leakage current detection line, a second leakage current detection line, and at least one resistive element and/or at least one semiconductor element, configured to detect a leakage current signal on the first current-carrying line or the second current-carrying line and to generate a leakage fault signal in response to detecting the leakage current signal,
   wherein the first leakage current detection line and second leakage current detection line are electrically insulated from each other, and respectively cover one of the first current-carrying line and the second current-carrying line, and wherein the at least one resistive element and/or the at least one semiconductor element is coupled in series between the first leakage current detection line and the second leakage current detection line to form a current path, for detecting an open circuit fault in the leakage current detection module.

2. The device of claim 1, wherein each of the first and second leakage current detection lines has a first end and a second end, the first end being located closer to the input end than the second end is and the second end being located closer to the output end than the first end is, and wherein the second end of the first leakage current detection line is coupled to the second end of the second leakage current detection line via the at least one resistive element and/or at least one semiconductor element.

3. The device of claim 1, wherein each of the first and second leakage current detection lines has a first end and a second end, the first end being located closer to the input end than the second end is and the second end being located closer to the output end than the first end is, and wherein the first end of the first leakage current detection line is coupled to the second end of the second leakage current detection line via the at least one resistive element and/or at least one semiconductor element.

4. The device of claim 1, wherein each of the first and second leakage current detection lines has a first end and a second end, the first end being located closer to the input end than the second end is and the second end being located closer to the output end than the first end is, and wherein the second end of the first leakage current detection line is coupled to the first end of the second leakage current detection line via the at least one resistive element and/or at least one semiconductor element.

5. The device of claim 1, wherein each of the first and second leakage current detection lines has a first end and a second end, the first end being located closer to the input end than the second end is and the second end being located closer to the output end than the first end is, and wherein the first end of the first leakage current detection line is coupled to the first end of the second leakage current detection line via the at least one resistive element and/or at least one semiconductor element.

6. The device of claim 1, wherein the at least one resistive element includes a resistor, a capacitor, an inductor, or a conductor having a non-negligible resistance.

7. The device of claim 1, wherein the least one semiconductor element includes a diode, a bipolar transistor, a field-effect transistor, or a silicon controlled rectifier.

8. The device of claim 1, further comprising:
   a detection monitoring module, coupled to the leakage current detection module, configured to detect an open circuit fault condition in the first leakage current detection line and the second leakage current detection lines by monitoring the current path, and to generate an open circuit fault signal in response to detecting the open circuit fault condition.

9. The device of claim 8, wherein the detection monitoring module includes at least one resistor and/or at least one diode.

10. The device of claim 8, further comprising:
    a switch module configured to control an electrical connection and disconnection between the input and output ends of the first and second current-carrying lines; and
    a drive module coupled to the leakage current detection module and/or the detection monitoring module, configured to drive the switch module to disconnect the electrical connection in response to the leakage fault signal and/or the open circuit fault signal.

11. The device of claim 1, further comprising an insulating structure covering at least one of the first leakage current detection line and the second leakage current detection line.

12. The device of claim 11, wherein the insulating structure is formed integrally of a plastic material or formed of an insulating paper or insulating fabric.

13. The device of claim 1, wherein the first leakage current detection line or the second leakage current detection line is formed of a sheet shaped single-sided insulating material which is electrically insulating on one side and electrically conductive on another side.

14. The device of claim 1, further comprising:
a test module, coupled to the leakage current detection module and including a manually operable test switch, configured to generate a simulated leakage current in the current path when the test switch is operated, to test the leakage current detection module.

15. An electrical power connection device, comprising:
a body; and
the leakage current detection and interruption device of claim 1, disposed inside the body.

16. An electrical appliance, comprising:
an electrical load; and
an electrical power connection device coupled between a power supply and the electrical load, configured to supply power to the electrical load, wherein the electrical power connection device includes the leakage current detection and interruption device of claim 1.

* * * * *